US009575518B2

(12) United States Patent
Geng et al.

(10) Patent No.: US 9,575,518 B2
(45) Date of Patent: Feb. 21, 2017

(54) COMPUTER HOUSING

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Chao Geng, Wuhan (CN); Chuan Lin, Wuhan (CN)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 33 days.

(21) Appl. No.: 14/684,093

(22) Filed: Apr. 10, 2015

(65) Prior Publication Data

US 2016/0259381 A1    Sep. 8, 2016

(30) Foreign Application Priority Data

Mar. 6, 2015    (CN) .......................... 2015 1 0099253

(51) Int. Cl.
*H05K 5/00* (2006.01)
*G06F 1/18* (2006.01)
*H05K 5/02* (2006.01)

(52) U.S. Cl.
CPC ............. *G06F 1/182* (2013.01); *H05K 5/0004* (2013.01); *H05K 5/02* (2013.01)

(58) Field of Classification Search
CPC .......... F06F 1/181; H05K 5/0004; H05K 5/02; H05K 5/0217
See application file for complete search history.

(56) References Cited

U.S. PATENT DOCUMENTS

| 6,373,692 | B1* | 4/2002 | Cheng | G06F 1/181 |
| | | | | 220/4.02 |
| 6,398,325 | B1* | 6/2002 | Chen | G06F 1/181 |
| | | | | 292/128 |
| 6,407,912 | B1* | 6/2002 | Chen | G06F 1/183 |
| | | | | 312/223.1 |
| 2002/0074911 | A1* | 6/2002 | Chen | A47B 47/03 |
| | | | | 312/265.5 |
| 2004/0196623 | A1* | 10/2004 | Erickson | G06F 1/181 |
| | | | | 361/679.59 |
| 2005/0013105 | A1* | 1/2005 | Lin | G06F 1/181 |
| | | | | 361/679.58 |
| 2006/0061949 | A1* | 3/2006 | Chen | G06F 1/181 |
| | | | | 361/679.02 |
| 2006/0197417 | A1* | 9/2006 | Chen | G06F 1/181 |
| | | | | 312/223.2 |

(Continued)

*Primary Examiner* — Daniel Rohrhoff
(74) *Attorney, Agent, or Firm* — Zhigang Ma (57) ABSTRACT

A housing of a computer includes a cover, a body, and a locking mechanism. The locking mechanism is mounted on the cover. The locking mechanism includes a handle and a sliding plate. The handle is configured to rotate between a first position and a second position relative to the cover. The handle is configured to push the sliding plate. When the handle is in the first position, the sliding plate is engaged with the cover and the body to fix the cover to the body. When the handle is in the second position, the sliding plate is away from the body and the cover is unlocked from the body.

20 Claims, 7 Drawing Sheets

(56) References Cited

U.S. PATENT DOCUMENTS

| | | | |
|---|---|---|---|
| 2007/0210684 A1* | 9/2007 | Lin | G06F 1/181 |
| | | | 312/223.2 |
| 2013/0147324 A1* | 6/2013 | Chen | G06F 1/181 |
| | | | 312/223.1 |
| 2014/0028164 A1* | 1/2014 | Chen | G06F 1/181 |
| | | | 312/223.2 |
| 2014/0042882 A1* | 2/2014 | Chen | G06F 1/181 |
| | | | 312/223.1 |

* cited by examiner

COMPUTER HOUSING

CROSS-REFERENCE TO RELATED APPLICATIONS

This application claims priority to Chinese Patent Application No. 201510099253.3 filed on Mar. 6, 2015, the contents of which are incorporated by reference herein.

FIELD

The subject matter herein generally relates to a housing for a computer.

BACKGROUND

Computer housings usually include a cover and a body, the cover is removably fixed to the body.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" when utilized, means "including, but not necessarily limited to"; it specifically indicates open-ended inclusion or membership in the so-described combination, group, series and the like.

The present disclosure is described in relation to a housing of a computer.

Figure 1:
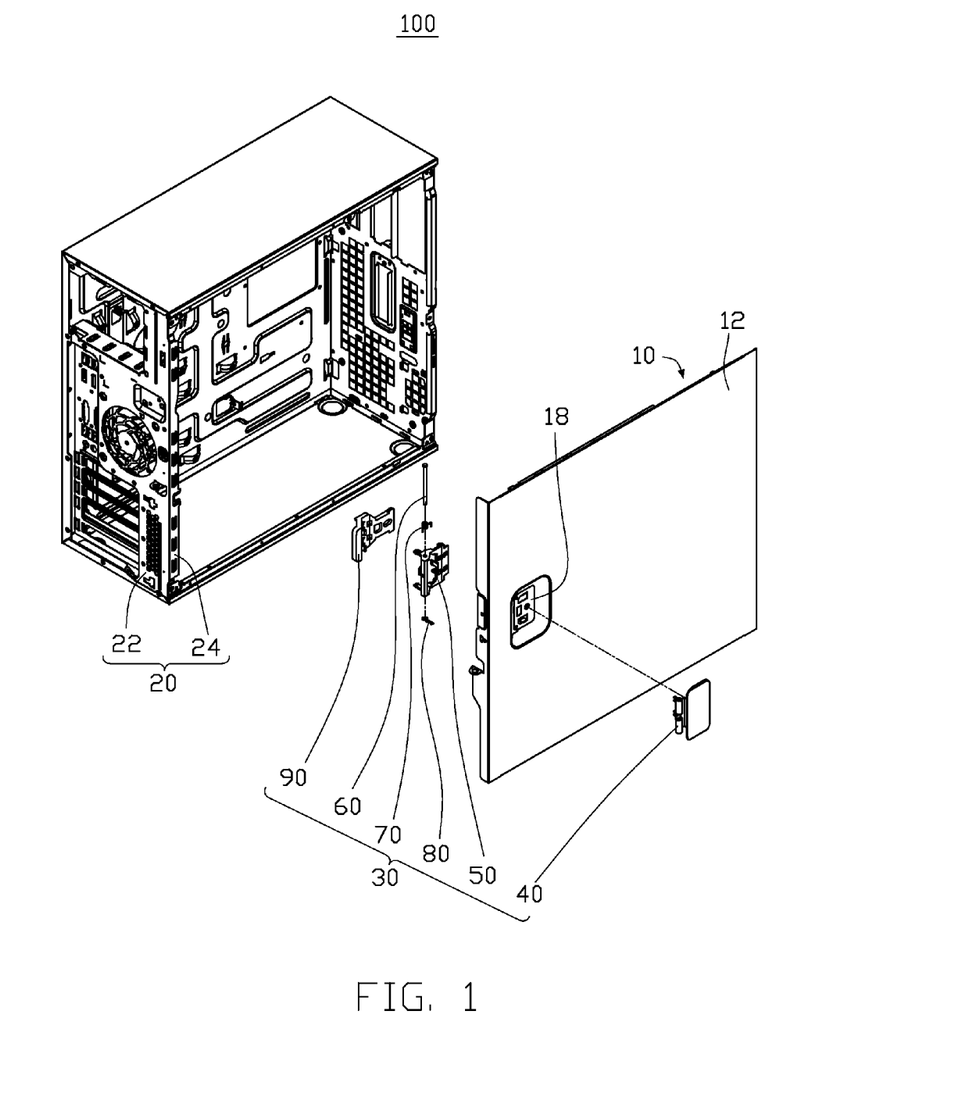
FIG. 1 is an exploded, isometric view of one embodiment of a housing of a computer.
Figure 2:
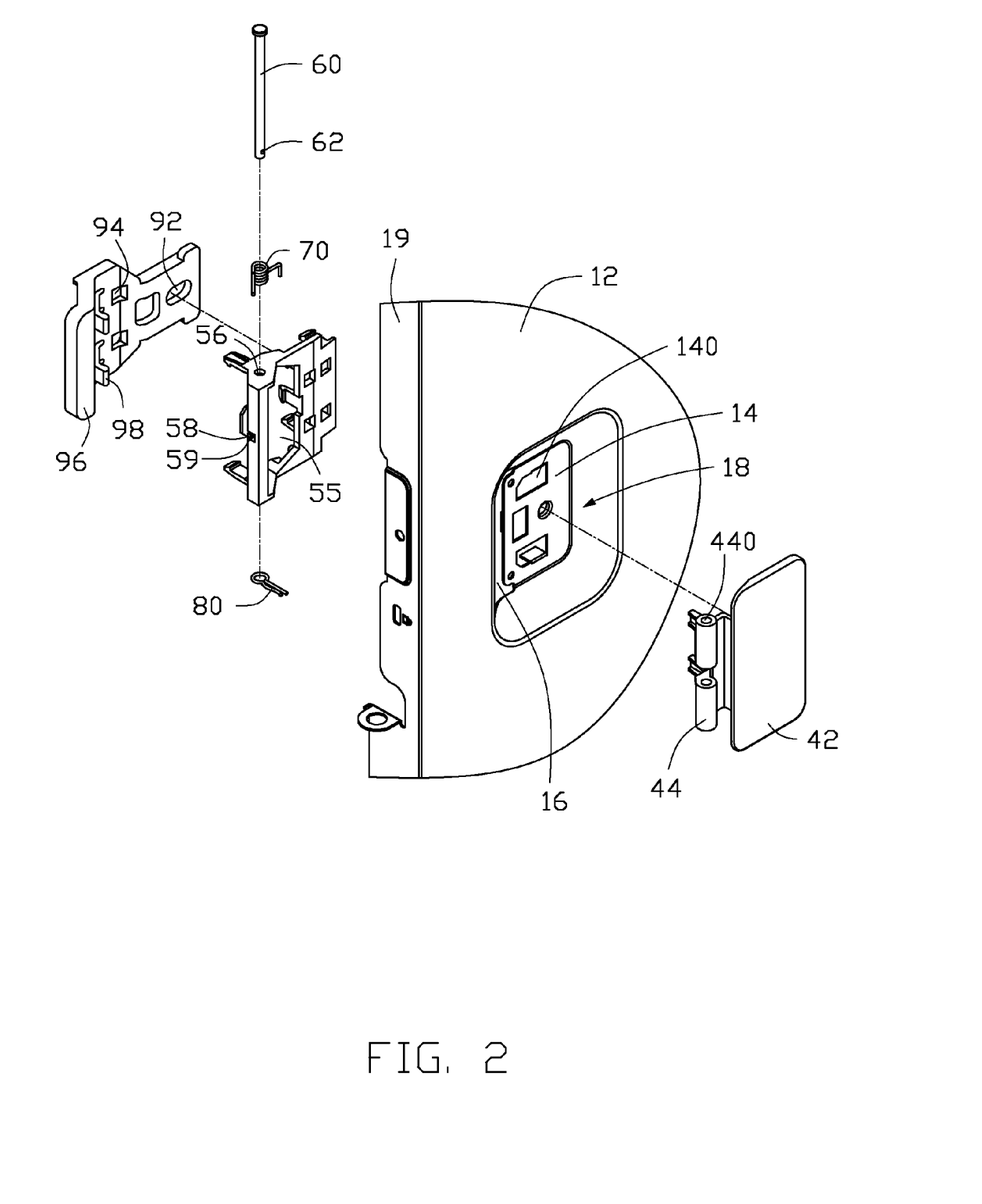
FIG. 2 is an enlarged view of a portion of FIG. 1.
Figure 3:
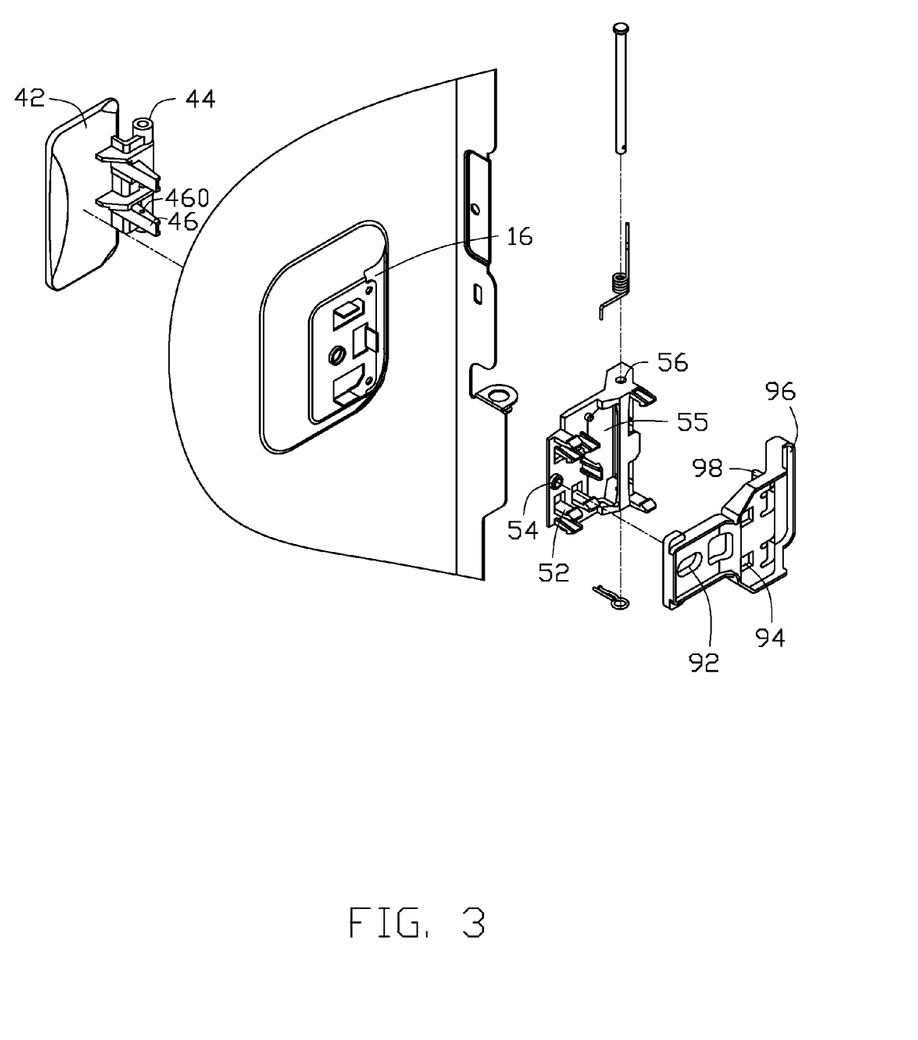
FIG. 3 is similar to FIG. 2, but viewed from another angle.
Figure 4:
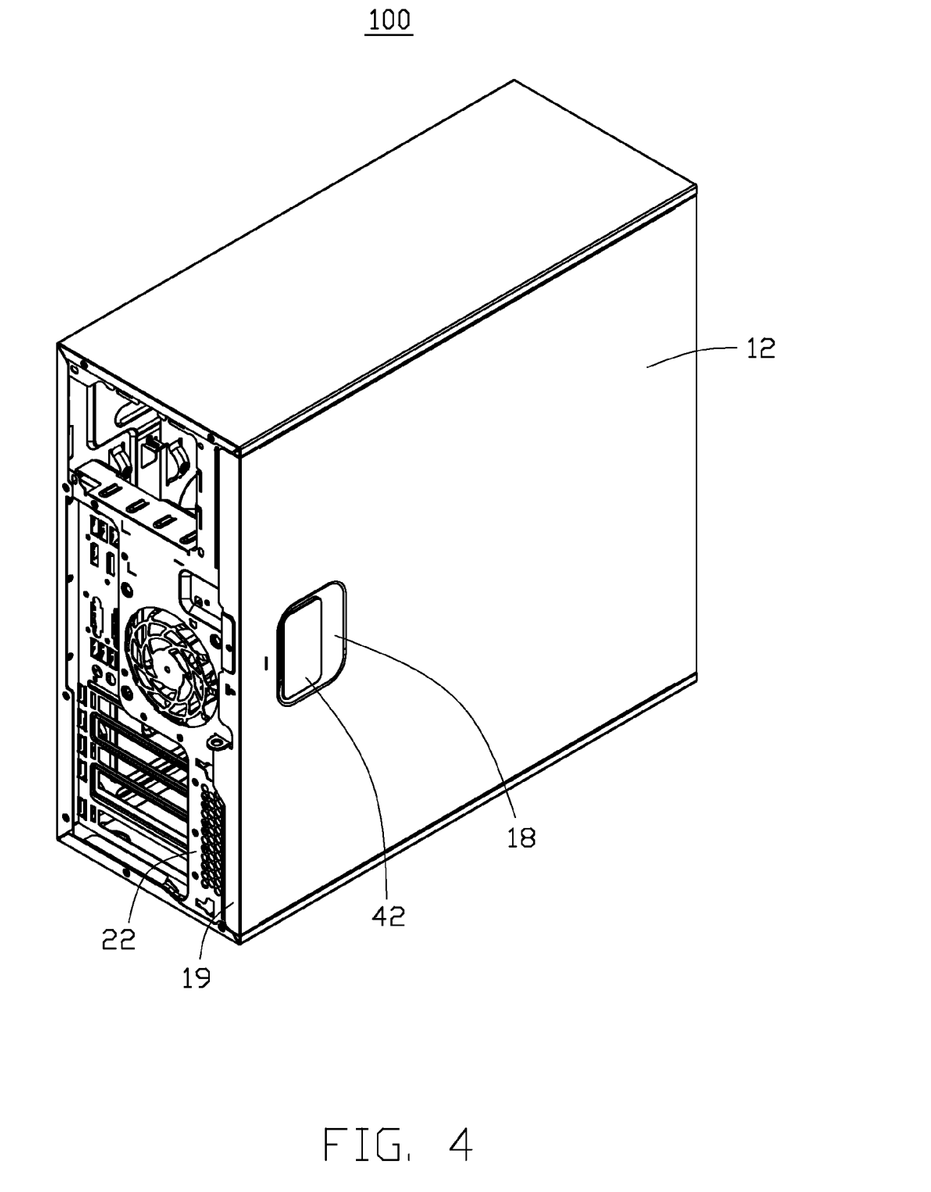
FIG. 4 is an assembled, isometric view of the housing of the computer of FIG. 1.
Figure 5:
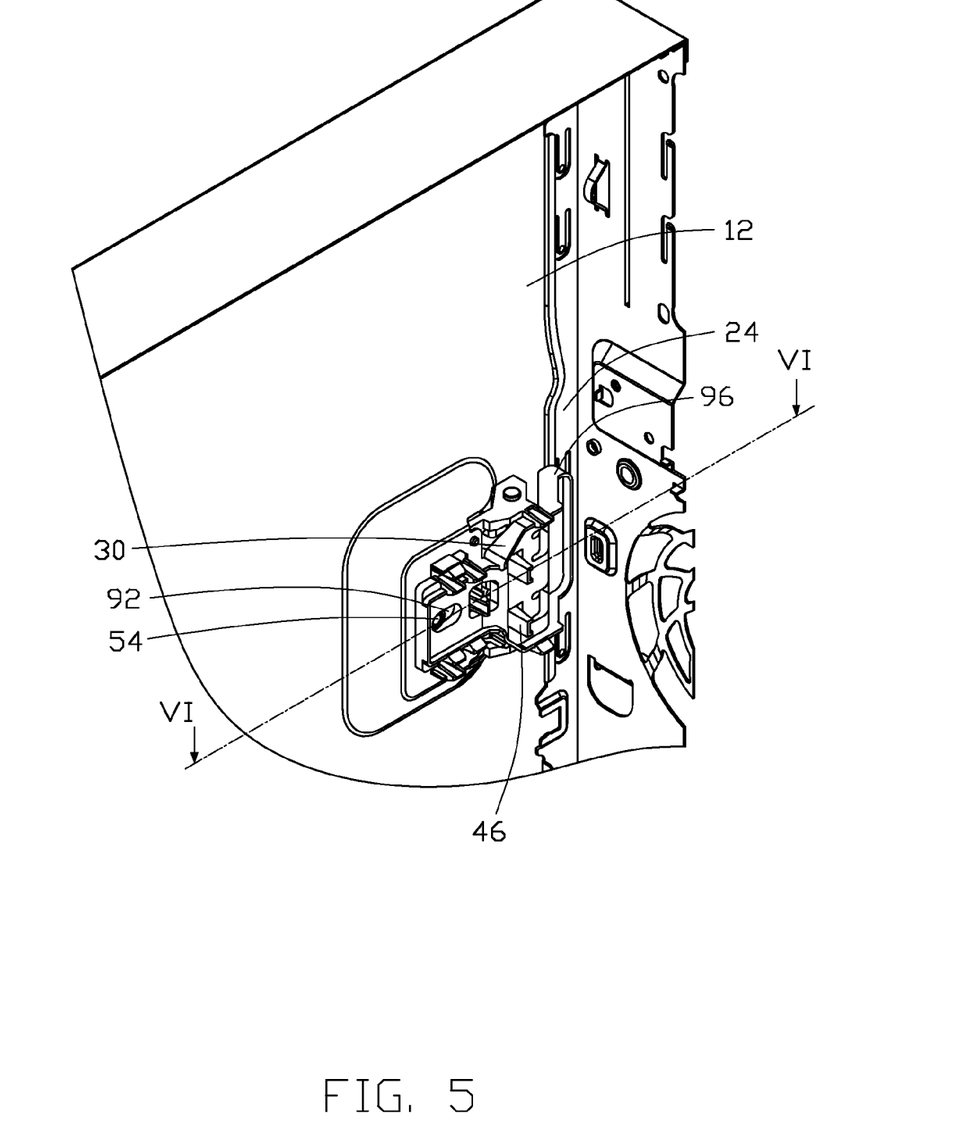
FIG. 5 is an isometric view of an internal structure of housing of the computer of FIG. 4.

FIGS. 1-3 illustrate one embodiment of a housing of a computer 100. The housing includes a cover 10, a body 20, and a locking mechanism 30.

The cover 10 includes a plate 12 and a first side plate 19. The first side plate 19 extends substantially perpendicular from the plate 12. A recess (not labeled) is defined in the plate 12. A mounting plate 14 is formed in the recess defining a receiving space 18 in the plate 12. A first opening 16 is defined in one side of the mounting plate 14. The mounting plate 14 defines a plurality of fixing holes 140.

The body 20 includes a main portion 22 and a second side plate 24. The second side plate 24 extends from the main portion 22 and is substantially perpendicular to the main portion 22.

The locking mechanism 30 includes a handle 40, a bracket 50, a shaft 60, an elastic member 70, a snap spring 80, and a sliding plate 90. The handle 40 includes an operation portion 42, two rotating portions 44, and two extending portions 46. Two rotating portions 44 and two extending portions 46 extend from one side of the operation portion 42. A shaft hole 440 is defined in each rotating portion 44. A first connecting hole 460 is defined in one of the two extending portions 46. The bracket 50 includes a plurality of latching blocks 52 and a positioning post 54. A second opening 55, two mounting holes 56, a groove 58, and a second connecting hole 59 are defined in the bracket 50. Two mounting holes 56 are defined in the two sides of the bracket 50. The groove 58 is defined in one end of the bracket 50. The second connecting hole 59 is defined in one side of the groove 58. The shaft 60 defines a latching hole 62. The sliding plate 90 defines a sliding groove 92 and two holes 94. The sliding plate 90 further includes a pressing portion 96 and two elastic pieces 98. In one embodiment, the elastic member 70 can be a torsion spring. Two elastic pieces 98 can be substantially arc-shaped. The sliding plate 90 can be substantially curved.

FIGS. 4-7 illustrate assembled views of the housing of the computer of FIG. 1.

When the housing is assembled, one end of the bracket 50 passes through the first opening 16. The plurality of latching blocks 52 and the positioning post 54 are engaged with the plurality of fixing holes 140. Two rotating portions 44 and two extending portions 46 pass through the first opening 16 and the second opening 55. The elastic member 70 is located between the two rotating portions 44. The shaft 60 is engaged with the two mounting holes 56, two shaft holes 440, and the elastic member 70. The snap spring 80 is engaged with the latching hole 62 to prevent the shaft 60 from releasing from two mounting holes 56. Two ends of the elastic member 70 are respectively engaged with the first connecting hole 460 and the second connecting hole 59. The handle 40 is rotatably connected to the cover 10. The operation portion 42 is received in the receiving space 18. The sliding plate 90 is latched between the plurality of latching blocks 52. The positioning post 54 is located in the sliding groove 92. The two extending portions 46 are engaged with the two holes 94. The two elastic pieces 98 are engaged with the bracket 50. The main portion 22 abuts the second side plate 24. The second side plate 24 is clamped between the plate 12 and the pressing portion 96. The side plate 24 can be substantially parallel to the plate 12.

Figure 6:
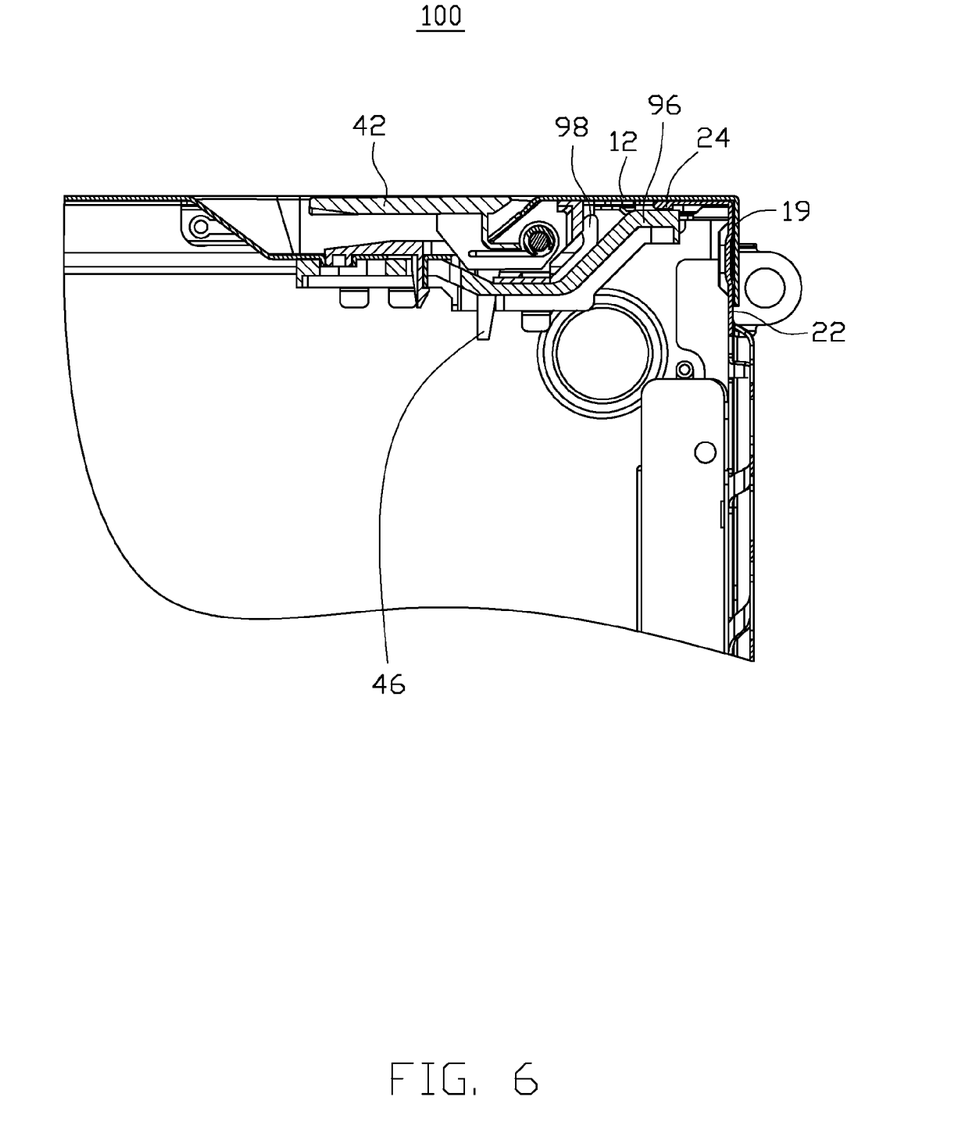
FIG. 6 is a cross-sectional view along lines VI-VI of FIG. 5.
Figure 7:
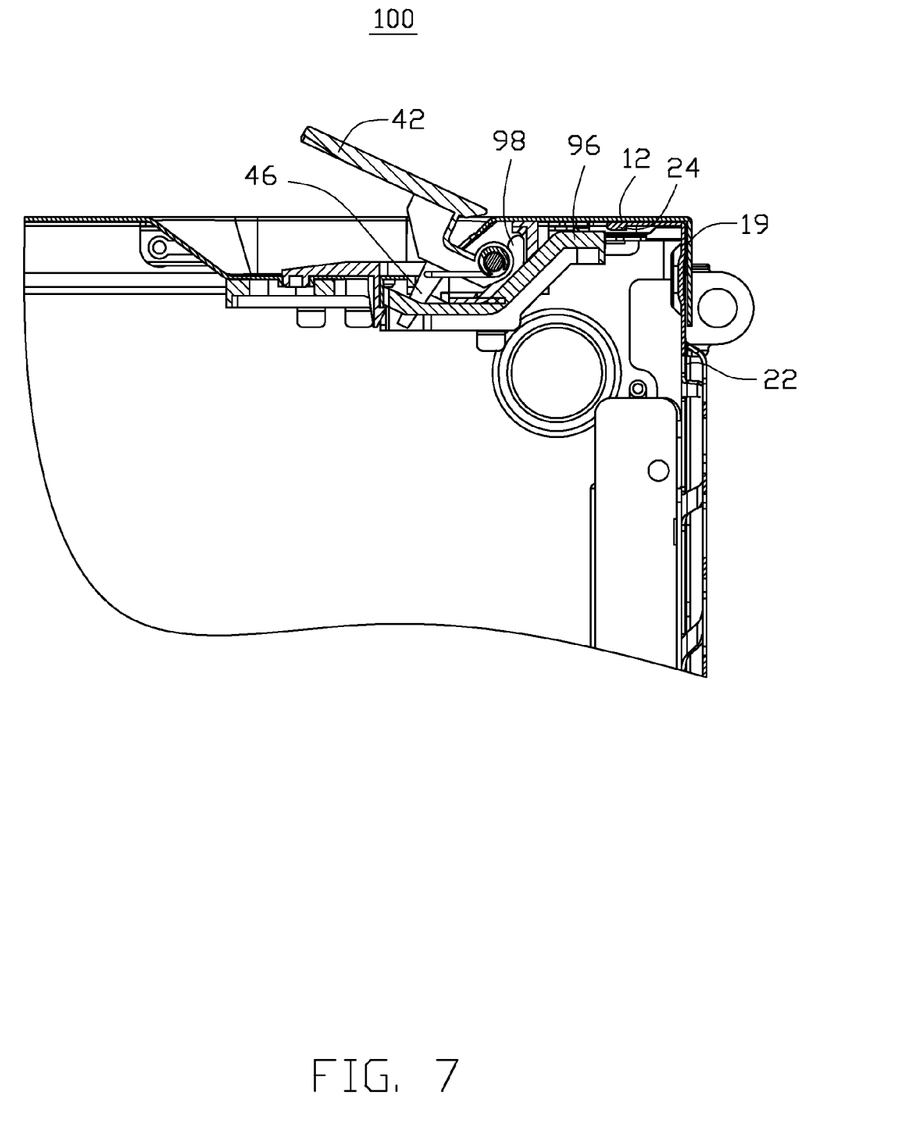
FIG. 7 is similar to FIG. 6, but shown in an unlocked state.

When the housing of computer 100 is in use, the operation portion 42 is forced to move from a first position to a second position. When the operation portion 42 is in the first position, the cover 10 is fixed with the body 20. When the handle 40 rotates, each extending portion 46 is engaged with an edge of each hole 94 to push the sliding plate 90 away from the main portion 22. The cover 10 is unlocked from the body 20. A moving direction of the sliding plate 90 can be substantially parallel to the second side plate 24. The two elastic pieces 98 and the elastic member 70 are deformed. When the force disappears, the elastic member 70 restores to full size and moves the handle 40 from the second position to the first position. Each extending portion 46 is engaged with another edge of each hole 94 to push the sliding plate 90 towards the main portion 22. The two elastic pieces 98 restore to full size and push the sliding plate 90 towards the main portion 22. The pressing portion 96 abuts the second side plate 24 to fix the cover 10 to the body 20.

The embodiments shown and described above are only examples. Many details are often found in the art such as the other features of a housing of computer. Therefore, many such details are neither shown nor described. Even though numerous characteristics and advantages of the present technology have been set forth in the foregoing description, together with details of the structure and function of the present disclosure, the disclosure is illustrative only, and changes may be made in the details, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A housing of a computer comprising:
   a cover;
   a body; and
   a locking mechanism mounted to the cover, and the locking mechanism comprising a handle and a sliding plate;
   wherein the handle is configured to rotate between a first position and a second position relative to the cover, when the handle is in the first position, the sliding plate is engaged with the cover to fix the cover to the body; and when the handle is in the second position, the sliding plate is driven away from the body by the handle and the cover is unlocked with the body.

2. The housing of claim 1, wherein the body comprises a second side plate, the cover comprises a plate, the side plate is substantially parallel to the plate, and a moving direction of the sliding plate is substantially parallel to the second side plate.

3. The housing of claim 2, wherein the body further comprises a main portion, the main portion is substantially perpendicular to the second side plate, the cover further comprises a first side plate, the first side plate is substantially perpendicular to the plate, when the handle is in the first position, the second side plate is clamped between the plate and the sliding plate, and the main portion is engaged with the first side plate.

4. The housing of claim 1, wherein the locking mechanism further comprises a bracket, the cover comprises a mounting plate, a first opening is defined on one sides of the mounting plate, and one end of the bracket passes through the first opening and is engaged with the mounting plate.

5. The housing of claim 4, wherein the cover further comprises a plate, the mounting plate and a receiving space are formed by a recess of the plate, the handle is received in the receiving space and is rotatably fixed with the bracket.

6. The housing of claim 5, wherein the locking mechanism further comprises a shaft, the bracket defines two mounting holes, the handle comprises two rotating portions, each rotating portion defines a shaft hole, and the shaft is engaged with two mounting holes and two shaft holes.

7. The housing of claim 6, wherein the locking mechanism further comprises a snap spring, one end of the shaft defines a latching hole, and the snap spring is engaged with the latching hole to prevent the shaft removing from two mounting holes.

8. The housing of claim 6, wherein the locking mechanism further comprises an elastic member, the elastic member is mounted on the shaft, and two ends of the elastic member are respectively engaged with the handle and the bracket.

9. The housing of claim 4, wherein the handle comprises two extending portions, the sliding plate defines two holes, the two extending portions are engaged with the two holes, when the handle rotates relative to the cover, each extending portions abuts an edge of each hole to push the sliding plate.

10. The housing of claim 4, wherein the sliding plate defines a sliding groove, the bracket includes a positioning post, the positioning post is located in the sliding groove.

11. A housing of a computer comprising:
    a cover;
    a body; and
    a locking mechanism comprising a handle and a sliding plate;
    wherein the handle is rotatably fixed with the cover, the sliding plate is slidably installed with the cover, when the handle rotate relative to the cover, the handle is configured to push the sliding plate, the sliding plate is engaged with the cover and the body to fix the cover to the body.

12. The housing of claim 11, wherein the body comprises a second side plate, the cover comprises a plate, the side plate is substantially parallel to the plate, and a moving direction of the sliding plate is substantially parallel to the second side plate.

13. The housing of claim 12, wherein the body further comprises a main portion, the main portion is substantially perpendicular to the second side plate, the cover further comprises a first side plate, the first side plate is substantially perpendicular to the plate, the second side plate is clamped between the plate and the sliding plate, and the main portion is engaged with the first side plate.

14. The housing of claim 11, wherein the locking mechanism further comprises a bracket, the cover comprises a mounting plate, a first opening is defined on one sides of the mounting plate, and one end of the bracket passes through the first opening and is engaged with the mounting plate.

15. The housing of claim 14, wherein the cover further comprises a plate, the mounting plate and a receiving space are formed by a recess of the plate, the handle is received in the receiving space and is rotatably fixed with the bracket.

16. The housing of claim 15, wherein the locking mechanism further comprises a shaft, the bracket defines two mounting holes, the handle comprises two rotating portions, each rotating portion defines a shaft hole, and the shaft is engaged with two mounting holes and two shaft holes.

17. The housing of claim 16, wherein the locking mechanism further comprises a snap spring, one end of the shaft defines a latching hole, and the snap spring is engaged with the latching hole to prevent the shaft removing from two mounting holes.

18. The housing of claim 16, wherein the locking mechanism further comprises an elastic member, the elastic member is mounted on the shaft, and two ends of the elastic member are respectively engaged with the handle and the bracket.

19. The housing of claim 14, wherein the handle comprises two extending portions, the sliding plate defines two holes, the two extending portions are engaged with the two holes, when the handle rotates relative to the cover, each extending portions abuts an edge of each hole to push the sliding plate.

20. A computer housing comprising:
   a housing body having a plurality of sides, the plurality of sides cooperating to define receiving space with an opening;
   a cover positionable to substantially cover the opening of the receiving space; and
   a locking mechanism mounted on the cover, the locking mechanism having a handle pivotally attached to the cover and a sliding plate activated by rotation of the handle;
   wherein, the handle is rotatable between a first position to a second position; and
   wherein, when the handle is the first position, the sliding plate is engaged with a portion of the housing body and when the handle is the second position, the sliding plate is disengaged from the portion of the housing body disengaging the cover from the housing body.

* * * * *